United States Patent
Chu et al.

(10) Patent No.: US 12,033,876 B2
(45) Date of Patent: Jul. 9, 2024

(54) MASS TRANSFER METHOD AND MASS TRANSFER DEVICE THEREOF FOR MICRO LED DEVICE

(71) Applicants: Beijing BOE Display Technology Co., Ltd., Beijing (CN); BOE Technology Group Co., Ltd., Beijing (CN)

(72) Inventors: Bohua Chu, Beijing (CN); Bo Zhou, Beijing (CN); Yanming Liu, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 695 days.

(21) Appl. No.: 17/269,831

(22) PCT Filed: Jun. 15, 2020

(86) PCT No.: PCT/CN2020/096169
§ 371 (c)(1),
(2) Date: Feb. 19, 2021

(87) PCT Pub. No.: WO2020/253653
PCT Pub. Date: Dec. 24, 2020

(65) Prior Publication Data
US 2021/0242056 A1 Aug. 5, 2021

(30) Foreign Application Priority Data
Jun. 18, 2019 (CN) .......................... 201910524978.0

(51) Int. Cl.
*H01L 21/673* (2006.01)
*H01L 33/00* (2010.01)

(52) U.S. Cl.
CPC .... *H01L 21/67333* (2013.01); *H01L 33/0093* (2020.05)

(58) Field of Classification Search
None
See application file for complete search history.

(56) References Cited

U.S. PATENT DOCUMENTS

2010/0101601 A1\* 4/2010 Takahara .......... H01L 21/67028
134/1
2011/0024734 A1\* 2/2011 Furst ...................... H10K 71/12
257/E51.001
(Continued)

FOREIGN PATENT DOCUMENTS

CN 104167369 A 11/2014
CN 104350613 A 2/2015
(Continued)

OTHER PUBLICATIONS

Liquid Metal Printed Electronics, by Liu Jing, Wang Qian, Shanghai Century Publishing (Group) Co., Ltd., 1st Edition Jan. 2019, ISBN 978-7-5478-4219-5/TB.8.
(Continued)

*Primary Examiner* — Hsien Ming Lee
(74) *Attorney, Agent, or Firm* — IPro, PLLC (57) ABSTRACT

This disclosure discloses a mass transfer method and mass transfer device thereof for micro-LED devices, wherein the mass transfer method includes: coating a surface, provided with micro-LED devices, of an epitaxial substrate with a flexible covering solution; curing the flexible covering solution to form a flexible covering layer wrapping the micro-LED devices; turning over the epitaxial substrate with the flexible covering layer wrapping the micro-LED devices, for locating the epitaxial substrate on an upper side of the flexible covering layer; separating the epitaxial substrate from the micro-LED devices; butting a surface, provided with the micro-LED devices, of the flexible covering layer against a receiving substrate; turning over the receiving substrate in butt joint with the micro-LED devices, for
(Continued)

locating the flexible covering layer on an upper side of the receiving substrate; and separating the flexible covering layer from the micro-LED devices.

20 Claims, 5 Drawing Sheets (56) References Cited

U.S. PATENT DOCUMENTS

| | | |
|---|---|---|
| 2013/0285086 A1 | 10/2013 | Hu et al. |
| 2015/0091204 A1* | 4/2015 | Uekido ............... H05K 1/0346 264/167 |
| 2015/0210048 A1* | 7/2015 | Jeong ................. C03C 17/3405 428/212 |
| 2015/0217550 A1 | 8/2015 | Gosnell et al. |
| 2016/0282978 A1* | 9/2016 | Wang .................... B32B 27/38 |
| 2017/0154819 A1 | 6/2017 | Bower et al. |
| 2018/0166429 A1 | 6/2018 | Chong et al. |
| 2018/0233536 A1* | 8/2018 | Chang ................. H01L 33/385 |
| 2018/0331247 A1 | 11/2018 | Lee et al. |
| 2018/0342407 A1 | 11/2018 | Chen |
| 2019/0088526 A1 | 3/2019 | Bower et al. |
| 2020/0235212 A1 | 7/2020 | Lu et al. |
| 2021/0242056 A1 | 8/2021 | Chu et al. |

FOREIGN PATENT DOCUMENTS

| | | |
|---|---|---|
| CN | 104837644 A | 8/2015 |
| CN | 106058010 A | 10/2016 |
| CN | 106384711 A | 2/2017 |
| CN | 106716610 A | 5/2017 |
| CN | 107154374 A | 9/2017 |
| CN | 109850882 A | 6/2019 |
| CN | 110224002 A | 9/2019 |
| IN | 103887218 A | 6/2014 |
| WO | 2017082699 A1 | 5/2017 |

OTHER PUBLICATIONS

CN201910524978.0_OA1.
CN201910524978.0_OA2.
CN201910524978.0_Decision of Rejection.

* cited by examiner

S100 — coating a surface, provided with the micro-LED devices 2, of an epitaxial substrate 1 with a flexible covering solution, and curing the flexible covering solution to form a flexible covering layer 3 wrapping the micro-LED devices 2

S200 — turning over the epitaxial substrate with the flexible covering layer wrapping the micro-LED devices, for locating the epitaxial substrate on an upper side of the flexible covering layer S300 — separating the epitaxial substrate from the micro-LED devices, for enabling the flexible covering layer to serve as a carrier of the micro-LED devices S400 — butting a surface, provided with the micro-LED devices 2, of the flexible covering layer 3 against a receiving substrate 5

S500 — turning over the receiving substrate 5 in butt joint with the micro-LED devices 2, for locating the flexible covering layer 3 on the upper side of the receiving substrate 5

S600 — separating the flexible covering layer 3 from the micro-LED devices 2, for enabling the receiving substrate 5 to serve as the carrier of the micro-LED devices 2

MASS TRANSFER METHOD AND MASS TRANSFER DEVICE THEREOF FOR MICRO LED DEVICE

CROSS REFERENCE TO RELATED APPLICATIONS

This disclosure is a national phase entry under 35 U.S.C. § 371 of International Application No. PCT/CN2020/096169, filed on Jun. 15, 2020, which claims priority to Chinese Patent Application No. 201910524978.0, filed with the China National Intellectual Property Administration on Jun. 18, 2019 and entitled "Method and Equipment for Preparing Micro-LED Panel", the entire contents of which are incorporated herein by reference.

FIELD

This disclosure relates to the technical field of display equipment, in particular to a mass transfer method and mass transfer device thereof for micro-LED devices.

BACKGROUND

In recent years, due to high contrast, bendability and other characteristics, organic light-emitting diode (OLED) panels rise rapidly and phase out liquid crystal panels; and micro-LED display panels are widely regarded as substitutes for the OLED panels due to various excellent indicators such as brightness, service life, contrast, response time, energy consumption, viewing angle and resolution.

At present, a major obstacle to the mass production of the micro-LED display panels is how to accurately transfer micro-LED devices produced on an epitaxial substrate to a receiving substrate and maintain a low loss rate of the micro-LED devices.

SUMMARY

Embodiments of this disclosure provides a mass transfer method of micro-LED devices, wherein the method includes: coating a surface, provided with the micro-LED devices, of an epitaxial substrate with a flexible covering solution; curing the flexible covering solution to form a flexible covering layer wrapping the micro-LED devices.

Turning over the epitaxial substrate with the flexible covering layer wrapping the micro-Light-emitting diode (micro-LED) devices, for locating the epitaxial substrate on an upper side of the flexible covering layer.

Separating the epitaxial substrate from the micro-LED devices, for enabling the flexible covering layer to serve as a carrier of the micro-LED devices.

Butting a surface, provided with the micro-LED devices, of the flexible covering layer against a receiving substrate.

Turning over the receiving substrate in butt joint with the micro-LED devices, for locating the flexible covering layer on an upper side of the receiving substrate.

And, separating the flexible covering layer from the micro-LED devices, for enabling the receiving substrate to serve as the carrier of the micro-LED devices.

Optionally, in the mass transfer method provided according to the embodiments of this disclosure, said coating the surface, provided with the micro-LED devices, of the epitaxial substrate with the flexible covering solution includes:
spraying the flexible covering solution on the surface, provided with the micro-LED devices, of the epitaxial substrate.

Optionally, in the mass transfer method provided according to the embodiments of this disclosure, the flexible covering solution includes a base solution and a catalyst, and the base solution includes polydimethylsiloxane, polyurethane acrylate or polymethyl methacrylate.

Optionally, in the mass transfer method provided according to the embodiments of this disclosure, a thickness of the flexible covering layer ranges from 0.5 mm to 1 mm.

Optionally, in the mass transfer method provided according to the embodiments of this disclosure, before said separating the flexible covering layer from the micro-LED devices, the method further includes: heating the flexible covering layer for a set period of time at a set temperature.

Optionally, in the mass transfer method provided according to the embodiments of this disclosure, the set temperature at which the flexible covering layer is heated is higher than a temperature at which the flexible covering solution is cured, and the set period of time for which the flexible covering layer is heated is longer than a period of time for which the flexible covering solution is cured.

Optionally, in the mass transfer method provided according to the embodiments of this disclosure, the temperature at which the flexible covering solution is cured ranges from 60° C. to 100° C., and the period of time for which the flexible covering solution is cured ranges from 10 min to 35 min; and the set temperature at which the flexible covering layer is heated ranges from 120° C. to 140° C., and the set period of time for which the flexible covering layer is heated ranges from 30 min to 40 min.

Optionally, in the mass transfer method provided according to the embodiments of this disclosure, sacrificial layers are arranged between the micro-LED devices and the epitaxial substrate; and said separating the epitaxial substrate from the micro-LED devices specifically includes:
irradiating the sacrificial layers by adopting a laser device to peel off the micro-LED devices from the epitaxial substrate.

Optionally, in the mass transfer method provided according to the embodiments of this disclosure, the flexible covering layer is provided with a first alignment mark, and the receiving substrate is provided with a second alignment mark and bonding layers; and
said butting the surface, provided with the micro-LED devices, of the flexible covering layer against the receiving substrate includes:
fitting the surface, provided with the micro-LED devices, of the flexible covering layer to the receiving substrate in an aligned mode based on the first alignment mark and the second alignment mark; and
bonding the receiving substrate and the micro-LED devices together through the bonding layers.

Optionally, in the mass transfer method provided according to the embodiments of this disclosure, a turning angle of turning over the epitaxial substrate with the flexible covering layer wrapping the micro-LED devices ranges from 175° to 185°; and a turning angle of turning over the receiving substrate in butt joint with the micro-LED devices ranges from 175° to 185°.

In another aspect, embodiments of this disclosure further provide mass transfer equipment of micro-LED devices, wherein the mass transfer equipment includes: coating equipment, configured to coat a surface, provided with micro-LED devices, of an epitaxial substrate with a flexible covering solution.

Curing equipment, configured to cure the flexible covering solution to form a flexible covering layer wrapping the micro-LED devices.

Turning equipment, configured to: turn over the epitaxial substrate with the flexible covering layer wrapping the micro-LED devices, for locating the epitaxial substrate on an upper side of the flexible covering layer;

separate the epitaxial substrate from the micro-LED devices, for enabling the flexible covering layer to serve as a carrier of the micro-LED devices;

butt a surface, provided with the micro-LED devices, of the flexible covering layer against a receiving substrate; and turn over the receiving substrate in butt joint with the micro-LED devices, for locating the flexible covering layer on an upper side of the receiving substrate.

And, separating equipment, configured to separate the flexible covering layer from the micro-LED devices, for enabling the receiving substrate to serve as the carrier of the micro-LED devices.

Optionally, in the mass transfer equipment provided according to the embodiments of this disclosure, the coating equipment is provided with a built-in spray head and the built-in spray head is configured to spray the flexible covering solution on the surface, provided with the micro-LED devices, of the epitaxial substrate.

Optionally, in the mass transfer equipment provided according to the embodiments of this disclosure, the turning equipment is provided with a built-in laser device and the built-in laser device is configured to separate the epitaxial substrate from the micro-LED devices for enabling the flexible covering layer to serve as the carrier of the micro-LED devices.

Optionally, in the mass transfer equipment provided according to the embodiments of this disclosure, the separating equipment is further configured to clean the receiving substrate carrying the micro-LED devices.

DETAILED DESCRIPTION OF THE EMBODIMENTS

A micro-LED device is a display technology that miniaturizes and matrixes a traditional LED structure to manufacture a drive circuit via a CMOS integrated circuit process so as to realize addressing control and individual drive of each pixel. Due to the fact that the micro-LED device prevails over an LCD technology in terms of brightness, service life, contrast, response time, energy consumption, viewing angle, resolution and other indicators, and has the advantages of being self-luminous, simple in structure, small in size and energy-saving, the micro-LED device has been regarded by many manufacturers as the next generation of display technology and begun to be actively deployed.

A core technical problem faced by micro-LED display panels during industrialization is a mass transfer technology of micro-LED devices. Due to the fact that the micro-LED devices are very small, and the mass transfer technology requires very high efficiency, qualified ratio and transfer precision, the mass transfer technology has become one of key technologies for mass production of the micro-LED display panels. Therefore, how to design a complete set of mass transfer technology which is simple, practical, economical, efficient, high qualified ratio and high in transfer precision is a problem to be solved by this disclosure.

Technical solutions in the embodiments of this disclosure will be clearly and completely described below in conjunction with the accompanying drawings in the embodiments of this disclosure. Apparently, the described embodiments are only a part of the embodiments of this disclosure, rather than all the embodiments. Based on the embodiments in this disclosure, all other embodiments obtained by those of ordinary skill in the art without creative work fall within the protection scope of this disclosure.

Figure 1:
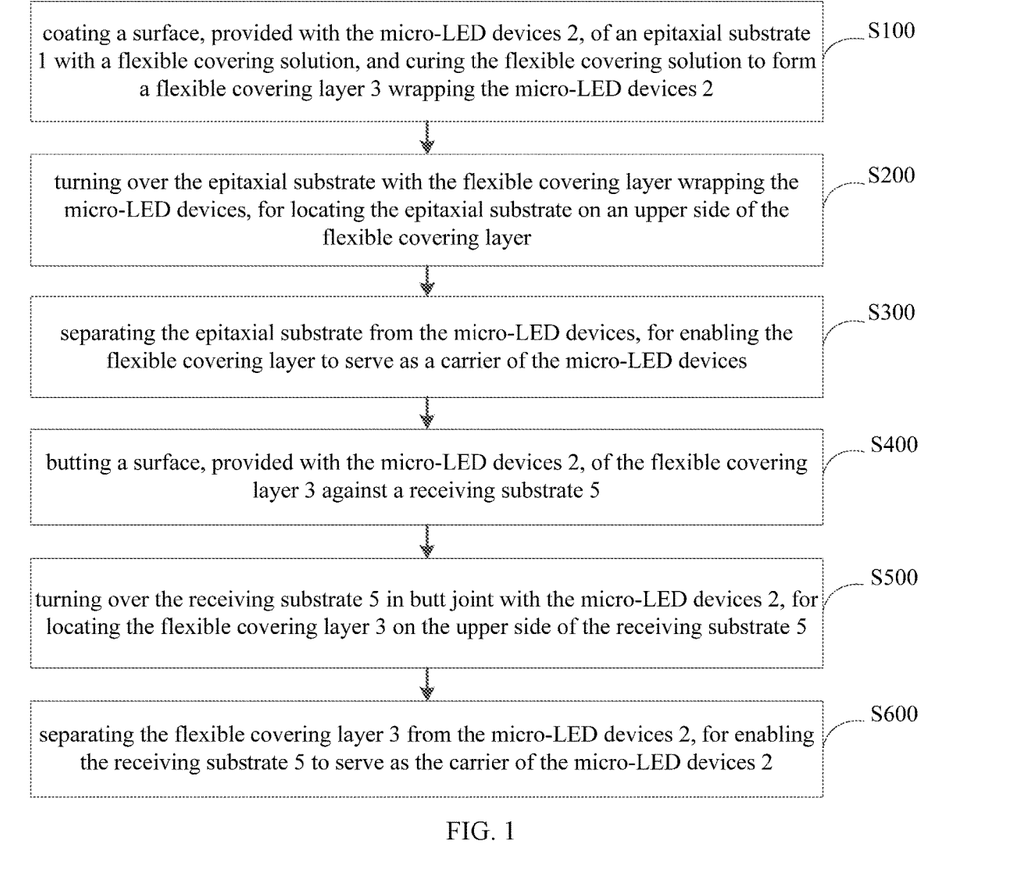
FIG. 1 is a flowchart of a mass transfer method of micro-LED devices provided according to embodiments of this disclosure.

As shown in FIG. 1, Embodiments of this disclosure provide a mass transfer method of micro-LED devices, wherein the method includes.

Figure 2A:
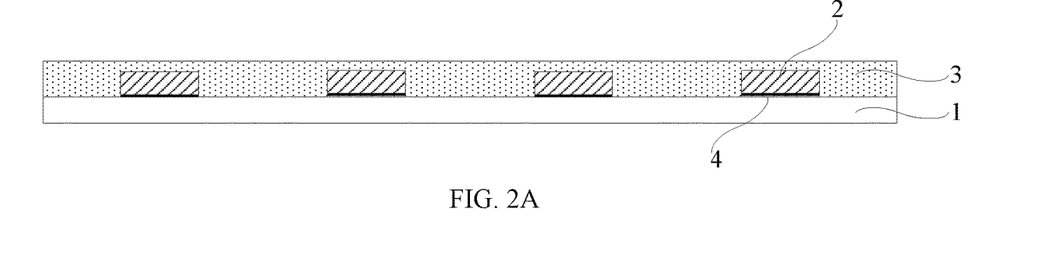
FIG. 2A is schematic diagram of state after a step in a mass transfer method of micro-LED devices provided according to embodiments of this disclosure.

S100, coating a surface, provided with the micro-LED devices 2, of an epitaxial substrate 1 with a flexible covering solution, and curing the flexible covering solution to form a flexible covering layer 3 wrapping the micro-LED devices 2. Specifically, after step S100, a state shown in FIG. 2A is obtained.

Specifically, inkjet equipment and a curing box (also called curing equipment) in Cell process zone equipment for preparing an LCD may be adopted. In other words, the INKJET equipment is adopted to spray the flexible covering solution on the surface, provided with the micro-LED devices, of the epitaxial substrate. Then the epitaxial substrate 1 coated with the flexible covering solution is transferred to the curing equipment by a mechanical arm. The flexible covering solution is dried into the flexible covering layer in the curing equipment, and then the epitaxial substrate is transferred to next equipment through the mechanical arm.

Specifically, the flexible covering solution generally contains a base solution and a catalyst which are colorless and transparent fluid liquids, and are fully mixed according to a certain ratio. The base solution includes but is not limited to polydimethylsiloxane, polyurethane acrylate or polymethyl methacrylate. The ratio of the base solution to the catalyst ranges from 1:1 and 10:1. Settings of a raw material mixing ratio and a coating thickness of the flexible covering solution are relatively flexible, and may be determined according to the number of micro-LED devices which need to be transferred. It is only necessary to ensure that the flexible covering layer 3 obtained after curing of the flexible covering solution can withstand mechanical strength required in a transfer process.

Specifically, the polydimethylsiloxane (PDMS) is low in cost, simple to use, good in adhesion to silicon wafers, and good in chemical inertness. Therefore, the embodiments of this disclosure may adopt the PDMS as the base solution, and the ratio of the base solution to the catalyst is 4:1.

Specifically, a temperature at which the flexible covering solution is cured ranges from 60° C. to 100° C., for example, 60° C., 70° C., 80° C., 90° C., and 100° C., and a period of time for which the flexible covering layer is cured ranges from 10 min to 35 min, for example, 10 min, 20 min, 30 min, and 35 min. If the temperature is too high, surface energy of the flexible covering layer 3 will be too low, flexibility becomes poor, and the micro-LED devices 2 may not be strictly wrapped. If the temperature is too low, the flexible covering layer 3 cannot be formed and cannot hold the micro-LED devices 2. Therefore, the temperature should not be too high or too low, and it is necessary to ensure that the flexible covering layer 3 has certain surface energy, so as to better wrap the micro-LED devices 2 and facilitate transfer.

In addition, the thickness of the flexible covering layer 3 ranges from 0.5 mm to 1 mm, for example, 0.5 mm, 0.7 mm, 0.9 mm, and 1 mm. If the thickness is too high, a material of the flexible covering layer 3 will be wasted while no additional beneficial effects can be brought. If the thickness is too low, the flexible covering layer 3 cannot well wrap or hold the micro-LED devices 2.

Figure 2B:
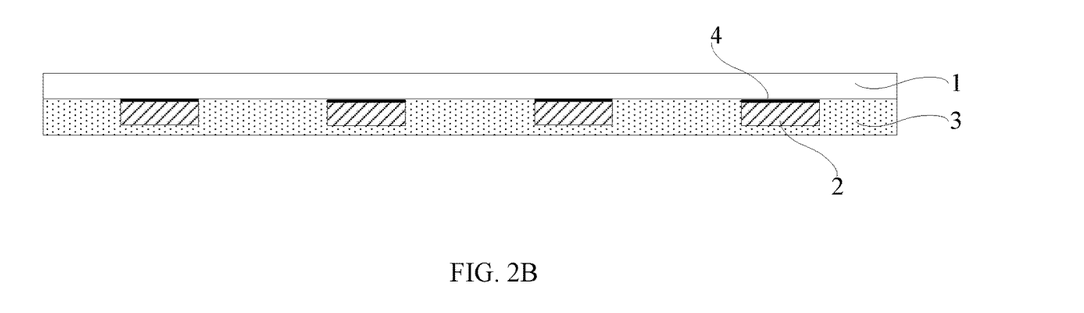
FIG. 2B is schematic diagram of state after another step in a mass transfer method of micro-LED devices provided according to embodiments of this disclosure.

S200, turning over the epitaxial substrate 1 with the flexible covering layer 3 wrapping the micro-LED devices 2, for locating the epitaxial substrate 1 on an upper side of the flexible covering layer 3. Specifically, a state shown in FIG. 2B is obtained after step S200.

Specifically, turning equipment in the Cell process section equipment for preparing the LCD may be adopted.

Specifically, a turning angle of turning over the epitaxial substrate 1 with the flexible covering layer 3 wrapping the micro-LED devices 2 may range from 175° to 185°, for example, 175°, 177°, 180°, 182°, and 185°.

Figure 2C:
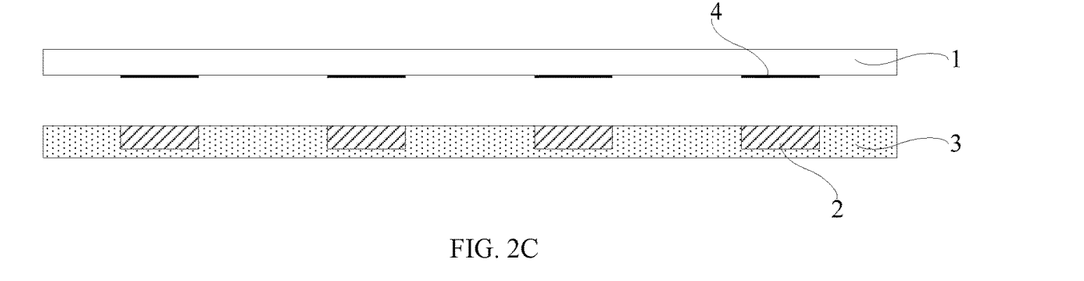
FIG. 2C is schematic diagram of state after another step in a mass transfer method of micro-LED devices provided according to embodiments of this disclosure.

S300, separating the epitaxial substrate 1 from the micro-LED devices 2, for enabling the flexible covering layer 3 to serve as a carrier of the micro-LED devices 2. Specifically, a state shown in FIG. 2C is obtained after step S300.

Specifically, a laser device placed inside the turning equipment in the Cell process section equipment for preparing the LCD may be adopted.

Specifically, when the micro-LED devices 2 are fabricated on the epitaxial substrate 1, sacrificial layers 4 are generally formed first, that is, the sacrificial layers 4 are arranged between the micro-LED devices 2 and the epitaxial substrate 1, and undercut structures are formed on edges of the sacrificial layers 4 so as to facilitate separation of the micro-LED devices 2 from the epitaxial substrate 1. The sacrificial layers 4 may be arranged on a whole surface of the epitaxial substrate 1, or may be arranged in one-to-one correspondence to each micro-LED device 2, which is not limited herein. Separating the epitaxial substrate 1 from the micro-LED devices 2 may specifically include: the sacrificial layers 4 are irradiated with lasers to peel off the micro-LED devices 2 from the epitaxial substrate 1.

Specifically, by using the lasers to knock off the sacrificial layers 4 under the micro-LED devices 2, the flexible covering layer 3 together with the micro-LED devices 2 may be peeled off the epitaxial substrate 1 at the same time.

Figure 2D:
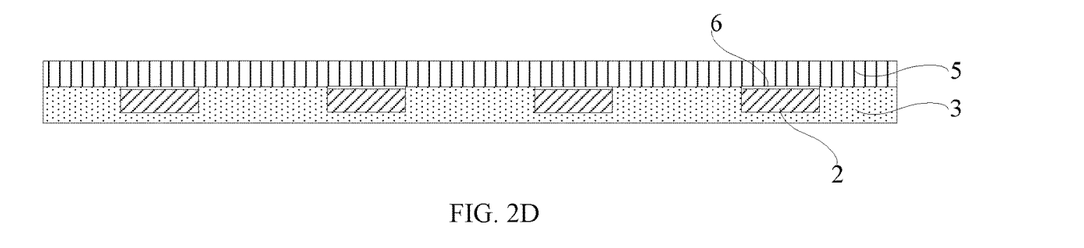
FIG. 2D is schematic diagram of state after another step in a mass transfer method of micro-LED devices provided according to embodiments of this disclosure.

S400, butting a surface, provided with the micro-LED devices 2, of the flexible covering layer 3 against a receiving substrate 5. Specifically, after step S400, a state shown in FIG. 2D is obtained.

Specifically, the turning equipment in the Cell process section equipment for preparing the LCD may be adopted.

Specifically, when the flexible covering layer 3 is formed, a first alignment mark may be formed on the flexible covering layer 3, and a second alignment mark and bonding layers 6 are formed on the receiving substrate 5. The first alignment mark and the second alignment mark may cooperate with each other to achieve accurate alignment, and edges of the bonding layers 6 are not provided with undercut structures, so as to facilitate close integration of the receiving substrate 5 and the micro-LED devices. The bonding layers 6 may be arranged on a whole surface of receiving substrate 5, or may be arranged in one-to-one correspondence to each micro-LED device 2, which is not limited herein.

Specifically, after separation in step S300, a surface, provided with the bonding layers 6, of the receiving substrate 5 is moved to an upper surface of the flexible covering layer 3, or the flexible covering layer 3 carrying the micro-LED devices 2 is transferred to a position below the bonding layers 6 of the receiving substrate 5. Afterwards, butting the surface, provided with the micro-LED devices 2, of the flexible covering layer 3 against the receiving substrate 5 specifically includes the following steps.

Firstly, fitting the surface, provided with the micro-LED devices, of the flexible covering layer 3 in an aligned mode based on the first alignment mark and the second alignment mark, the receiving substrate 5.

Afterwards, bonding the receiving substrate 5 and the micro-LED devices 2 together through the bonding layers 6. Specifically, lasers of a laser device in the turning equipment may be used to irradiate the bonding layers 6 to realize bonding of the receiving substrate 5 and the micro-LED devices 2.

Figure 2E:
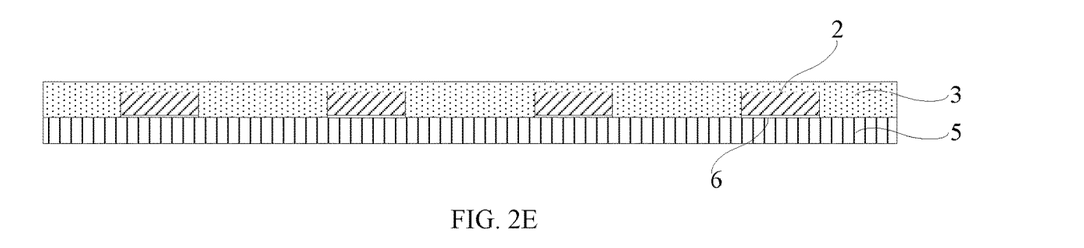
FIG. 2E is schematic diagram of state after another step in a mass transfer method of micro-LED devices provided according to embodiments of this disclosure.

S500, turning over the receiving substrate 5 in butt joint with the micro-LED devices 2, for locating the flexible covering layer 3 on the upper side of the receiving substrate 5. Specifically, after step S500, a state shown in FIG. 2E is obtained.

Specifically, the turning equipment in the Cell process section equipment for preparing the LCD may be adopted.

Specifically, a turning angle of turning over the receiving substrate 5 in butt joint with the micro-LED devices 2 may be 175° to 185°, for example, 175°, 177°, 180°, 182°, and 185°.

Figure 2F:
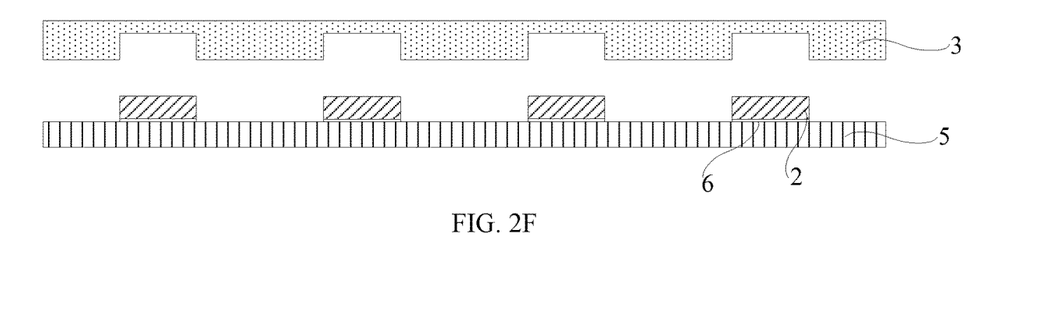
FIG. 2F is schematic diagram of state after another step in a mass transfer method of micro-LED devices provided according to embodiments of this disclosure.

S600, separating the flexible covering layer 3 from the micro-LED devices 2, for enabling the receiving substrate 5 to serve as the carrier of the micro-LED devices 2 to complete the transfer process of the micro-LED devices 2. Specifically, a state shown in FIG. 2F is obtained after step S600.

Specifically, separating (peeling) equipment in the Cell process section equipment for preparing the LCD may be adopted.

Specifically, before separating the flexible covering layer 3 from the micro-LED devices 2, the method may further include: the flexible covering layer 3 is heated at a set temperature for a set period of time, so as to reduce the surface energy of the flexible covering layer 3 and denature and deactivate the material of the flexible covering layer 3, and a pure elastic behavior and bottom surface energy of the material of the flexible covering layer 3 are adopted to facilitate separation of the flexible covering layer 3 from the receiving substrate 5.

Specifically, the set temperature at which the flexible covering layer 3 is heated is generally higher than a temperature at which the flexible covering solution is cured, and the set period of time for which the flexible covering layer 3 is heated is longer than a period of time for which the flexible covering solution is cured, so as to ensure that the surface energy of the flexible covering layer 3 can be reduced in a heating process.

Specifically, the temperature at which the flexible covering layer 3 is heated ranges from 120° C. to 140° C., for example, 120° C., 130° C., and 140° C. The set period of time for which the flexible covering layer 3 is heated ranges from 30 min to 40 min, for example, 30 min, 35 min, and 40 min.

Figure 3A:
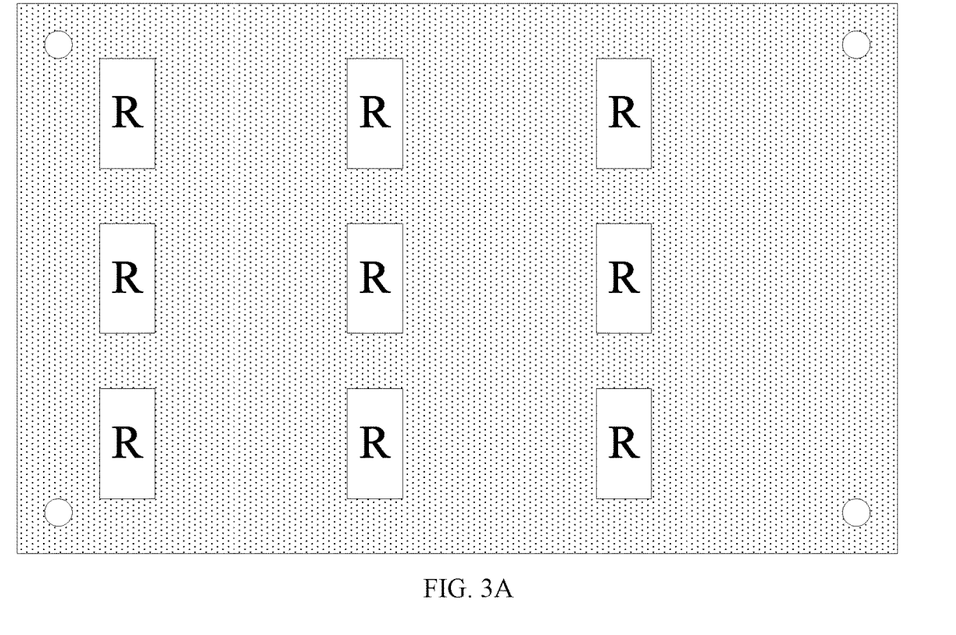
FIG. 3A is a schematic diagram of distribution of micro-LED devices after the devices are transferred to a receiving substrate.
Figure 3B:
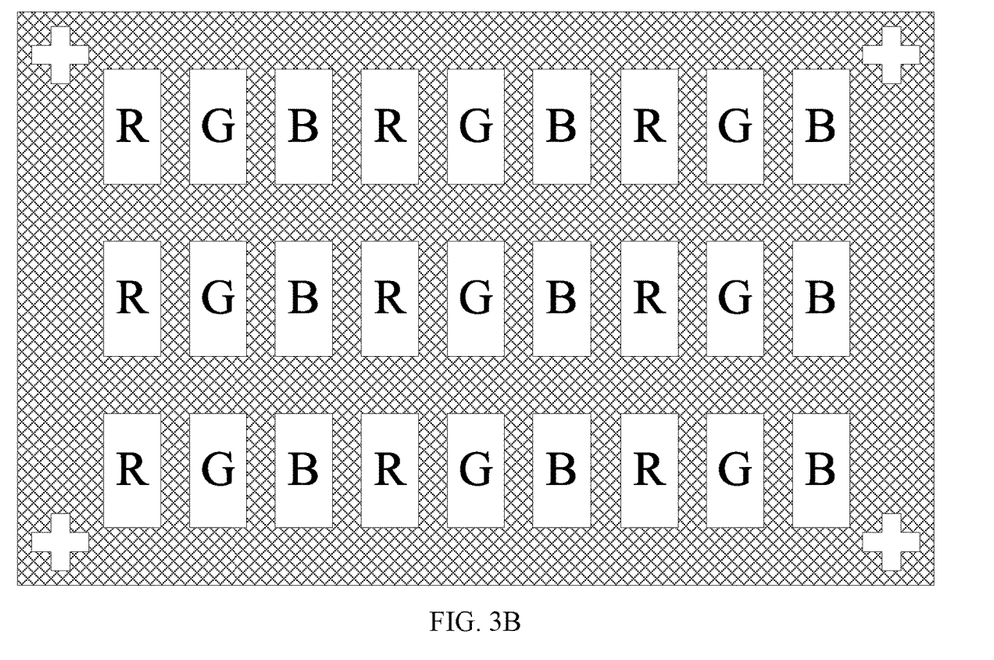
FIG. 3B is a schematic diagram of distribution of micro-LED devices after the devices are transferred to a drive backplane.

Specifically, in the process of adopting steps S100 to S600 to transfer the micro-LED devices 2 to the receiving substrate 5, the relative position between the micro-LED devices 2 is not changed, and as shown in FIG. 3A, final arrangement of monochromatic micro-LED devices 2 on the receiving substrate 5 is the same as that of the micro-LED devices 2 fabricated on the epitaxial substrate 1. Therefore, according to the arrangement of the micro-LED devices 2 of each color on a drive backplane of a display panel as shown in FIG. 3B, the monochromatic micro-LED devices 2 may be fabricated on different epitaxial substrates 1 respectively, and are then transferred to the drive backplane respectively through the receiving substrate 5, so that final fabrication of the display panel is completed.

Specifically, in the mass transfer method of the micro-LED devices provided according to the embodiments of this disclosure, by first forming the flexible covering layer 3 on the surface of the epitaxial substrate 1, the flexible covering layer 3 wraps the micro-LED devices 2, and the flexible covering layer 3 is cured. As the flexible covering layer 3 has certain flexibility, the position of each micro-LED device 2 can be fixed. Afterwards, the epitaxial substrate 1 covered with the flexible covering layer 3 is turned over to prevent the problem of falling of the micro-LED devices 2 due to the fact that the micro-LED devices 2 on the flexible covering layer 3 face downwards after the epitaxial substrate 1 is separated from the flexible covering layer 3. After the flexible covering layer 3 and the micro-LED devices 2 are peeled off from the epitaxial substrate 1, the receiving substrate 5 is turned over after butting with the surface, provided with the micro-LED devices, of the flexible covering layer, so that the micro-LED devices 2 are located on the upper surface of the receiving substrate 5, which is equivalent to making a next carrier of the micro-LED devices 2 hold the micro-LED devices 2 underneath again. The flexible covering layer 3 is peeled off from the receiving substrate 5, the flexible covering layer 3 is separated from the micro-LED devices 2, and therefore the mass transfer process of the micro-LED devices 2 is completed.

Specifically, in the mass transfer method provided according to the embodiments of this disclosure, by performing a turning process before two separation processes respectively, the carriers (the flexible covering layer 3 and the receiving substrate 5) of the micro-LED devices 2 hold the micro-LED devices 2 below the micro-LED devices 2 after separation to prevent a loss of the micro-LED devices 2 in the mass transfer process caused when the micro-LED devices 2 fall off due to gravity factors.

Specifically, in the mass transfer method provided according to the embodiments of this disclosure, the upper surfaces of the receiving substrate 5 and the flexible covering layer 3 may be accurately attached to each other in the aligned mode through the alignment marks, so that it is ensured that the micro-LED devices 2 can reach accurate positions on the receiving substrate 5, and transfer accuracy is improved.

Figure 4:
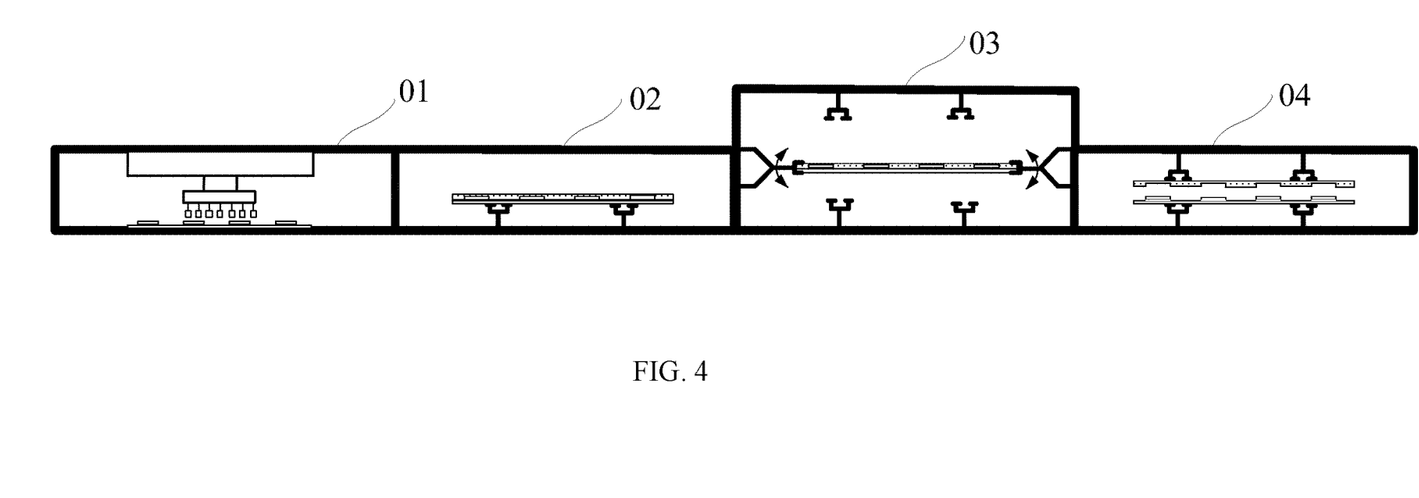
FIG. 4 is a schematic structural diagram of mass transfer equipment of micro-LED devices provided according to embodiments of this disclosure.

Based on the same inventive concept, Embodiments of this disclosure further provide mass transfer equipment of micro-LED devices, and as shown in FIG. 4, the mass transfer equipment specifically includes following equipment:

coating equipment 01, configured to coat a surface, provided with the micro-LED devices, of an epitaxial substrate with a flexible covering solution;

curing equipment 02, configured to cure the flexible covering solution to form a flexible covering layer wrapping the micro-LED devices;

turning equipment 03, configured to:
turn over the epitaxial substrate with the flexible covering layer wrapping the micro-LED devices for locating the epitaxial substrate to be located on an upper side of the flexible covering layer;
separate the epitaxial substrate from the micro-LED devices, for enabling the flexible covering layer to serve as a carrier of the micro-LED devices;
butting a surface, provided with the micro-LED devices, of the flexible covering layer against a receiving substrate; and
turn over the receiving substrate in butt joint with the micro-LED devices, for locating the flexible covering layer on an upper side of the receiving substrate; and separating equipment 04, configured to separate the flexible covering layer from the micro-LED devices, for enabling the receiving substrate to serve as the carrier of the micro-LED devices.

Specifically, each piece of equipment in the mass transfer equipment provided according to the embodiments of this disclosure may be implemented by each piece of equipment in a Cell process section for preparing an LCD, and a process is simple and easy to operate.

Specifically, in the mass transfer equipment provided according to the embodiments of this disclosure, the coating equipment 01 is provided with a built-in spray head and the built-in spray head is configured to spray the flexible covering solution on the surface, provided with the micro-LED devices, of the epitaxial substrate.

Specifically, in the mass transfer equipment provided according to the embodiments of this disclosure, the turning equipment 03 is provided with a built-in laser device and the built-in laser device is configured to separate the epitaxial substrate from the micro-LED devices, for enabling the flexible covering layer to serve as a carrier of the micro-LED devices. In addition, the laser device may also be configured to combine the receiving substrate with the micro-LED devices through bonding layers.

Specifically, in the mass transfer equipment provided according to the embodiments of this disclosure, the separating equipment 04 is further configured to clean the receiving substrate carrying the micro-LED devices.

Apparently, those skilled in the art may make various modifications and variations to the embodiments of this disclosure without departing from the spirit and scope of this disclosure. In this way, if these modifications and variations of this disclosure fall within the scope of the claims of this disclosure and their equivalent technologies, this disclosure is also intended to include these modifications and variations.

What is claimed is:

1. A mass transfer method of micro-LED devices, comprising:
   coating a surface, provided with micro-Light-emitting diode (micro-LED) devices, of a substrate with a flexible covering solution;
   curing the flexible covering solution to form a flexible covering layer wrapping the micro-LED devices;
   turning over the substrate with the flexible covering layer wrapping the micro-LED devices, for locating the substrate on an upper side of the flexible covering layer;
   separating the substrate from the micro-LED devices, for enabling the flexible covering layer to serve as a carrier of the micro-LED devices;
   butting a surface, provided with the micro-LED devices, of the flexible covering layer against a receiving substrate;
   turning over the receiving substrate in butt joint with the micro-LED devices, for locating the flexible covering layer on an upper side of the receiving substrate; and
   separating the flexible covering layer from the micro-LED devices, for enabling the receiving substrate to serve as the carrier of the micro-LED devices;
   wherein sacrificial layers are arranged between the micro-LED devices and the substrate; and
   said separating the substrate from the micro-LED devices comprises:
   irradiating the sacrificial layers by adopting a laser device to peel off the micro-LED devices from the substrate.

2. The mass transfer method according to claim 1, wherein said coating the surface, provided with the micro-LED devices, of the substrate with the flexible covering solution comprises:
   spraying the flexible covering solution on the surface, provided with the micro-LED devices, of the substrate.

3. The mass transfer method according to claim 1, wherein the flexible covering solution comprises a base solution and a catalyst, and the base solution comprises polydimethylsiloxane, polyurethane acrylate or polymethyl methacrylate.

4. The mass transfer method according to claim 1, wherein a thickness of the flexible covering layer ranges from 0.5 mm to 1 mm.

5. The mass transfer method according to claim 1, wherein before said separating the flexible covering layer from the micro-LED devices, the method further comprises:
   heating the flexible covering layer for a set period of time at a set temperature.

6. The mass transfer method according to claim 5, wherein the set temperature at which the flexible covering layer is heated is higher than a temperature at which the flexible covering solution is cured, and the set period of time for which the flexible covering layer is heated is longer than a period of time for which the flexible covering solution is cured.

7. The mass transfer method according to claim 6, wherein the temperature at which the flexible covering solution is cured ranges from 60° C. to 100° C., and the period of time for which the flexible covering solution is cured ranges from 10 min to 35 min; and the set temperature at which the flexible covering layer is heated ranges from 120° C. to 140° C., and the set period of time for which the flexible covering layer is heated ranges from 30 min to 40 min.

8. The mass transfer method according to claim 1, wherein the flexible covering layer is provided with a first alignment mark, and the receiving substrate is provided with a second alignment mark and bonding layers; and
   said butting the surface, provided with the micro-LED devices, of the flexible covering layer against the receiving substrate comprises:
   fitting the surface, provided with the micro-LED devices, of the flexible covering layer to the receiving substrate in an aligned mode based on the first alignment mark and the second alignment mark; and
   bonding the receiving substrate and the micro-LED devices together through the bonding layers.

9. The mass transfer method according to claim 8, wherein the bonding layers are arranged on a whole surface, facing the flexible covering layer, of the receiving substrate; or
   the bonding layers are arranged on a surface, facing the flexible covering layer, of the receiving substrate in one-to-one correspondence to each of the micro-LED devices.

10. The mass transfer method according to claim 1, wherein a turning angle of turning over the substrate with the flexible covering layer wrapping the micro-LED devices ranges from 175° to 185°; and a turning angle of turning over the receiving substrate in butt joint with the micro-LED devices ranges from 175° to 185°.

11. The mass transfer method according to claim 1, wherein the sacrificial layers are arranged on a whole surface, facing the flexible covering layer, of the substrate; or
   the sacrificial layers are arranged on a surface, facing the flexible covering layer, of the substrate in one-to-one correspondence to each of the micro-LED devices.

12. A micro-LED display panel, fabricated by the mass transfer method according to claim 1.

13. The mass transfer method according to claim 1, wherein the substrate is an epitaxial substrate.

14. Mass transfer equipment of micro-LED devices, comprising:
   coating equipment, configured to coat a surface, provided with micro-LED devices, of a substrate with a flexible covering solution;
   curing equipment, configured to cure the flexible covering solution to form a flexible covering layer wrapping the micro-LED devices;
   turning equipment, configured to:
      turn over the substrate with the flexible covering layer wrapping the micro-LED devices, for locating the substrate on an upper side of the flexible covering layer;
      separate the substrate from the micro-LED devices, for enabling the flexible covering layer to serve as a carrier of the micro-LED devices;
      butt a surface, provided with the micro-LED devices, of the flexible covering layer against a receiving substrate; and
      turn over the receiving substrate in butt joint with the micro-LED devices, for locating the flexible covering layer on an upper side of the receiving substrate; and
   separating equipment, configured to separate the flexible covering layer from the micro-LED devices, for enabling the receiving substrate to serve as the carrier of the micro-LED devices;
   wherein sacrificial layers are arranged between the micro-LED devices and the substrate; and the turning equipment is provided with a built-in laser device;

the built-in laser device is configured to: irradiate the sacrificial layers to peel off the micro-LED devices from the substrate for enabling the flexible covering layer to serve as the carrier of the micro-LED devices.

15. The mass transfer equipment according to claim 14, wherein the coating equipment is provided with a built-in spray head and the built-in spray head is configured to spray the flexible covering solution on the surface, provided with the micro-LED devices, of the substrate.

16. The mass transfer equipment according to claim 14, wherein the separating equipment is further configured to clean the receiving substrate carrying the micro-LED devices.

17. The mass transfer equipment according to claim 14, wherein the built-in laser device is further configured to bond the receiving substrate with the micro-LED devices through bonding layers of the receiving substrate.

18. A mass transfer method of micro-LED devices, comprising:
    coating a surface, provided with micro-Light-emitting diode (micro-LED) devices, of a substrate with a flexible covering solution;
    curing the flexible covering solution to form a flexible covering layer wrapping the micro-LED devices;
    turning over the substrate with the flexible covering layer wrapping the micro-LED devices, for locating the substrate on an upper side of the flexible covering layer;
    separating the substrate from the micro-LED devices, for enabling the flexible covering layer to serve as a carrier of the micro-LED devices;
    butting a surface, provided with the micro-LED devices, of the flexible covering layer against a receiving substrate;
    turning over the receiving substrate in butt joint with the micro-LED devices, for locating the flexible covering layer on an upper side of the receiving substrate; and
    separating the flexible covering layer from the micro-LED devices, for enabling the receiving substrate to serve as the carrier of the micro-LED devices;
    wherein the flexible covering layer is provided with a first alignment mark, and the receiving substrate is provided with a second alignment mark and bonding layers; and
    said butting the surface, provided with the micro-LED devices, of the flexible covering layer against the receiving substrate comprises:
        fitting the surface, provided with the micro-LED devices, of the flexible covering layer to the receiving substrate in an aligned mode based on the first alignment mark and the second alignment mark; and
        bonding the receiving substrate and the micro-LED devices together through the bonding layers.

19. The mass transfer method according to claim 18, wherein the bonding layers are arranged on a whole surface, facing the flexible covering layer, of the receiving substrate; or
    the bonding layers are arranged on a surface, facing the flexible covering layer, of the receiving substrate in one-to-one correspondence to each of the micro-LED devices.

20. The mass transfer method according to claim 18, wherein the substrate is an epitaxial substrate.

* * * * *